United States Patent
Kamins (10) Patent No.: US 7,566,657 B2
(45) Date of Patent: Jul. 28, 2009

(54) METHODS OF FORMING THROUGH-SUBSTRATE INTERCONNECTS

(75) Inventor: Theodore I. Kamins, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 162 days.

(21) Appl. No.: 11/654,338

(22) Filed: Jan. 17, 2007

(65) Prior Publication Data

US 2008/0171430 A1 Jul. 17, 2008

(51) Int. Cl.
H01L 21/44 (2006.01)

(52) U.S. Cl. .............. 438/667; 438/677; 257/E21.159; 257/E21.161; 977/890; 977/892

(58) Field of Classification Search ........ 438/677, 438/667, 674, 678; 427/E21.159, E21.161, 427/E21.171; 977/890, 891, 892
See application file for complete search history.

(56) References Cited

U.S. PATENT DOCUMENTS 5,347,258 A * 9/1994 Howard et al. .......... 338/333
7,105,428 B2 9/2006 Pan et al.
2004/0089948 A1 * 5/2004 Cheng et al. ........... 257/758
2005/0133476 A1 6/2005 Islam et al.
2006/0043535 A1 * 3/2006 Hiatt .................. 257/621
2006/0121199 A1 * 6/2006 Yang et al. ............. 427/304
2006/0267190 A1 11/2006 Terada et al.

FOREIGN PATENT DOCUMENTS

| KR | 1020030050597 | 6/2003 |
|---|---|---|
| KR | 1020050042774 | 5/2005 |
| WO | WO2006003620 | 1/2006 |

* cited by examiner

Primary Examiner—Caridad M Everhart (57) ABSTRACT

In one embodiment of a method of forming at least one through-substrate interconnect, a semiconductor substrate having first surface and an opposing second surface is provided. At least one opening is formed in the semiconductor substrate to extend from the first surface to an intermediate depth within the semiconductor substrate. The at least one opening is partially defined by a base. At least one metal-catalyst nanoparticle is provided on the base. Conductive material is deposited within the at least one opening under conditions in which the metal-catalyst nanoparticle promotes deposition of the conductive material. Material of the semiconductor substrate may be removed from the second surface to expose a portion of the conductive material filling the at least one opening. In another embodiment, instead of using the nanoparticle, the conductive material may be selected to selectively deposit on the base partially defining the at least one opening.

18 Claims, 10 Drawing Sheets

*Figure 4G* ent of the present invention relate to semiconductor fabrication. More particularly, embodiments of the present invention relate to methods of forming through-substrate interconnects in a semiconductor substrate.

METHODS OF FORMING THROUGH-SUBSTRATE INTERCONNECTS

TECHNICAL FIELD

Embodiments of the present invention relate to semiconductor fabrication. More particularly, embodiments of the present invention relate to methods of forming through-substrate interconnects in a semiconductor substrate.

BACKGROUND

Semiconductor devices, including integrated circuitry, are mass produced by fabricating hundreds or even thousands of identical circuit patterns on a single semiconductor wafer or other semiconductor substrate using photolithography in combination with various other processes. In recent years, research to increase the density of semiconductor devices in a semiconductor assembly has increased. One technique to increase the density of semiconductor devices in a semiconductor assembly is to stack multiple semiconductor substrates upon one another. Through-substrate interconnects are formed through the semiconductor substrates to provide a conductive pathway from an active surface of one of the semiconductor substrates to the semiconductor substrate's back surface to enable interconnection with another semiconductor substrate or a carrier substrate.

Figure 1:
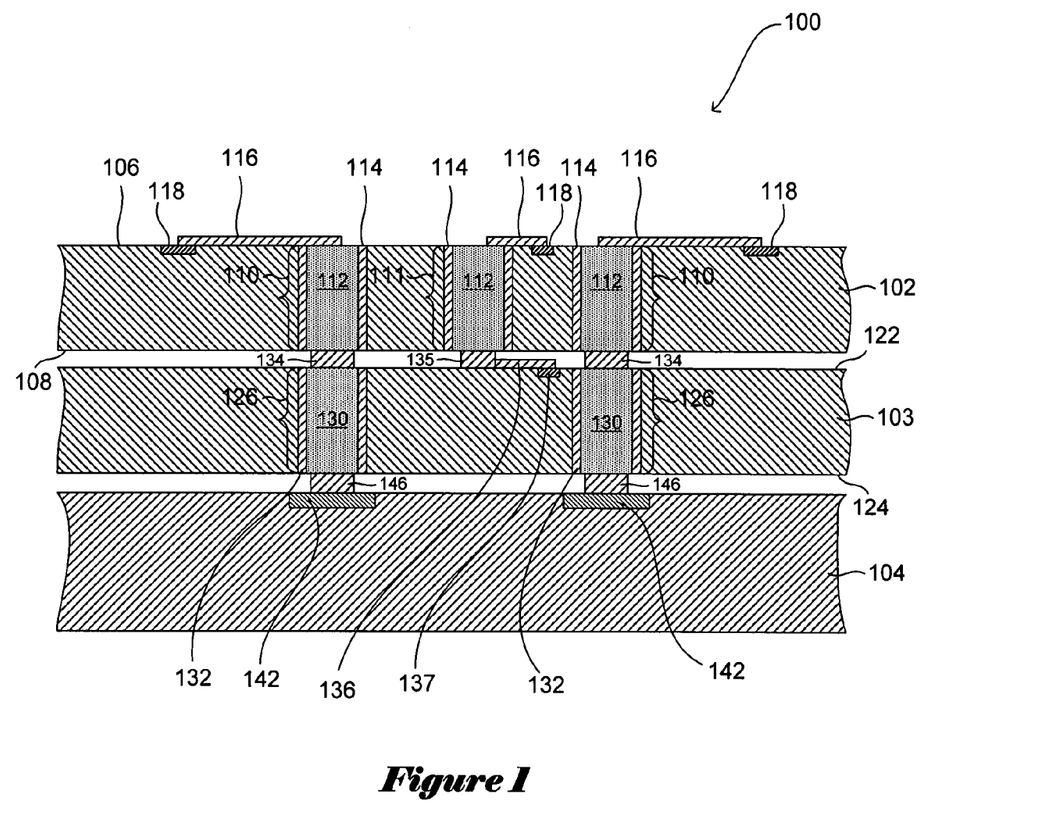
FIG. 1 is a schematic side cross-sectional view of a semiconductor-device assembly including multiple, stacked semiconductor substrates according to one currently available design.

An example of a currently available design for a semiconductor-device assembly that utilizes through-substrate interconnects is shown in FIG. 1. As shown in FIG. 1, a semiconductor-device assembly 100 includes a thinned semiconductor substrate 102, a thinned semiconductor substrate 103, and a carrier substrate 104, each of which may be electrically interconnected to each other. The semiconductor substrate 102 includes an active surface 106 and an opposing back surface 108. A number of active semiconductor devices (e.g., transistors) are formed under the active surface 106 and passive components (e.g., capacitors, resistors, or other components) may be formed on or under the active surface 106. Through-substrate interconnects 110 and 111 are formed by filling openings formed in the semiconductor substrate 102 with an electrically conductive material 112. Each of the through-substrate interconnects 110 and 111 also includes an insulating layer 114 that electrically isolates the through-substrate interconnects 110 and 111 from the semiconductor substrate 102. A conductive line 116 electrically couples the conductive material 112 in a corresponding through-substrate interconnect 110 and 111 to a corresponding contact region 118 electrically connected to active devices and/or passive components of the semiconductor substrate 102.

The semiconductor substrate 103 also includes an active surface 122 including active semiconductor devices formed thereunder and an opposing back surface 124. The semiconductor substrate 103 further includes through-substrate interconnects 126, each of which includes an opening filled with an electrically conductive material 130 and an insulating layer 132 that electrically isolates the through-substrate interconnects 126 from the semiconductor substrate 103. Contact pads 134 electrically connect each of the through-substrate interconnects 126 of the semiconductor substrate 103 to a corresponding through-substrate interconnect 110 of the semiconductor substrate 102. Active devices and/or passive components of the semiconductor substrate 103 are electrically coupled to a conductive line 136 through contact region 137. Additionally, a contact pad 135 is also electrically coupled to the through-substrate interconnect 111 and the conductive line 136. Thus, active devices and/or passive components of the semiconductor substrate 103 can be electrically connected to active devices and/or passive components of the semiconductor-substrate 102 by electrically coupling the through-substrate interconnect 111 to the conductive line 116 and the contact pad 135.

The carrier substrate 104, which may be another semiconductor substrate or other substrate, includes terminal pads 142 that are electrically connected to circuitry (not shown) of the carrier substrate 104. Each of the terminal pads 142 is electrically connected to a corresponding through-substrate interconnect 126 by, for example, contact pads 146 and, thus, electrically connected to active devices and/or passive components of the semiconductor substrate 102. Accordingly, a number of different semiconductor-device assemblies may be formed by appropriately stacking and electrically interconnecting semiconductor substrates using through-substrate interconnects.

Figure 2A:
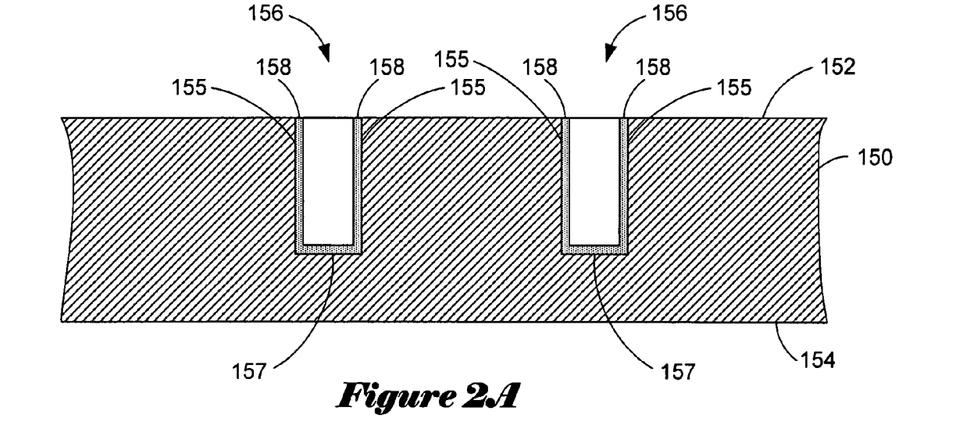
FIGS. 2A through 2C are schematic side cross-sectional views that illustrate one problem encountered when attempting to completely fill an opening formed in a semiconductor substrate according to one currently available process.
Figure 2B:
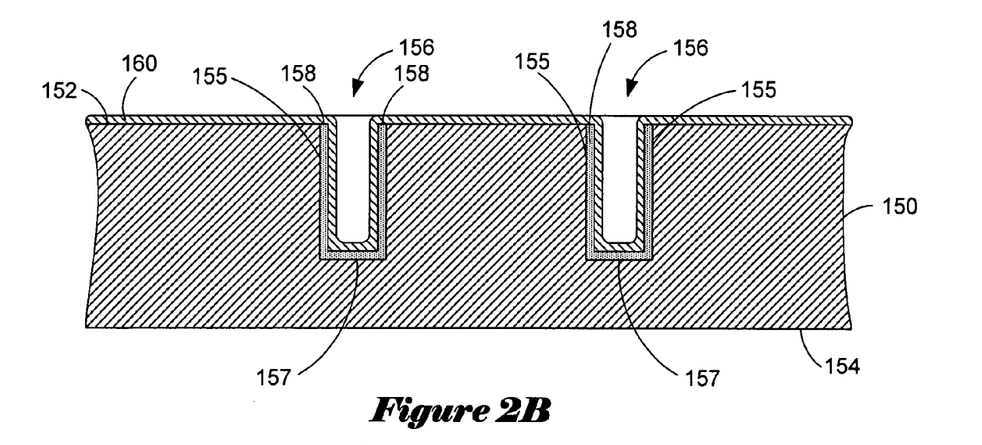
Figure 2C:
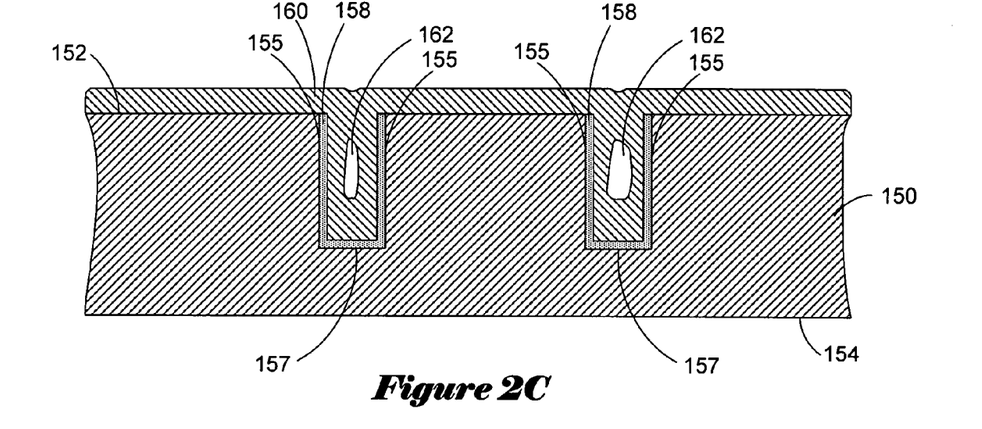

In order to conserve space on a semiconductor substrate for semiconductor devices, the through-substrate interconnects can be formed with a high-aspect ratio, such as a depth-to-width ratio of 10:1 or greater. However, high-aspect ratio through-substrate interconnects that are consistently and completely filled with conductive material can be difficult to form. FIGS. 2A through 2C illustrate one of the problems encountered when attempting to form high-aspect ratio through-substrate interconnects. As shown in FIG. 2A, a semiconductor substrate 150 including an active surface 152 and an opposing back surface 154 is provided. Openings 156 may be formed in the semiconductor substrate 150 to an intermediate depth from the active surface 152 by etching or by laser drilling. Sidewalls 155 and base 157 of each of the openings 156 may be coated with an insulating layer 158 to electrically isolate conductive material filling the openings 156 from the semiconductor substrate 150. When the openings 156 are subsequently attempted to be completely filled with a conductive material using a deposition process, such as an electrochemical deposition process or a physical deposition process, the conductive material may not completely fill the openings 156.

As shown in FIG. 2B, the conductive material 160 may nucleate, initially, on both the sidewalls 155 and base 157 of the openings 156. As shown in FIG. 2C, deposition of the conductive material 160 proceeds, with the conductive material 160 advancing inwardly until mouths of the openings 156 prematurely close, preventing complete filling of the openings 156 and forming voids 162. Therefore, the incompletely filled openings 156 cannot be reliably and reproducibly configured as low-resistance through-substrate interconnects, as shown in FIG. 1, for electrically connecting active devices and/or passive components of the semiconductor substrate 150 to another semiconductor substrate and/or carrier substrate stacked with the semiconductor substrate 150. Accordingly, researchers and developers of semiconductor devices continue to seek improved techniques for forming through-substrate interconnects in which openings formed in semiconductor substrates are consistently and substantially filled with conductive material.

SUMMARY

Various embodiments of the present invention are directed to methods of forming through-substrate interconnects. In one embodiment of the present invention directed to a method of forming at least one through-substrate interconnect, a semiconductor substrate having a first surface and an opposing second surface is provided. At least one opening is formed within the semiconductor substrate, with the at least one opening extending from the first surface to an intermediate depth within the semiconductor substrate. The at least one opening is partially defined by a base. At least one metal-catalyst nanoparticle is provided on the base. Conductive material is deposited within the at least one opening under conditions in which the metal-catalyst nanoparticle promotes deposition of the conductive material. Material of the semiconductor substrate may be removed from the second surface to expose a portion of the conductive material filling the at least one opening.

In another embodiment of the present invention directed to a method of forming at least one through-substrate interconnect, a semiconductor substrate having a first surface and an opposing second surface is provided. At least one opening is formed in the semiconductor substrate, with the at least one opening extending from the first surface to an intermediate depth within the semiconductor substrate. The at least one opening is defined by at least one sidewall comprising a first material and a base comprising a second material. The at least one opening is filled with a conductive material having a selectivity to preferentially nucleate on the second material that forms the base over the first material that forms the at least one sidewall. Material of the semiconductor substrate is removed from the second surface to expose a portion of the conductive material filling the at least one opening.

BRIEF DESCRIPTION OF THE DRAWINGS

The drawings illustrate various embodiments of the present invention, wherein like reference numerals refer to like elements or features in different views or embodiments shown in the drawings.

DETAILED DESCRIPTION OF THE VARIOUS EMBODIMENTS

Figure 3A:
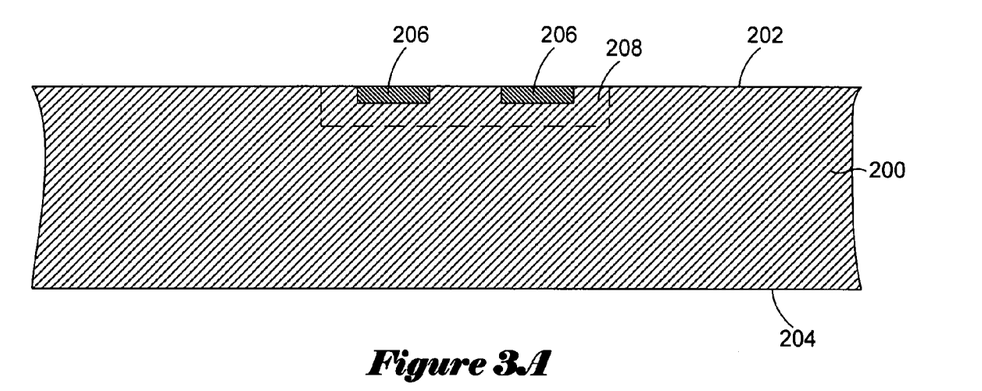
FIGS. 3A through 3K are schematic side cross-sectional views that illustrate various stages in a method of forming at least one through-substrate interconnect according to one embodiment of the present invention.

Various embodiments of the present invention are directed to methods of forming through-substrate interconnects. FIGS. 3A through 3K illustrate a method of forming at least one through-substrate interconnect, according to one embodiment of the present invention, in which at least one opening formed in a semiconductor substrate is filled with conductive material grown in the presence of a metal-catalyst nanoparticle. As shown in FIG. 3A, a semiconductor substrate 200 having an active surface 202 and an opposing back surface 204 is provided. The active surface 202 includes a number of contact regions 206 (only two being shown for simplicity) that are each electrically connected to active semiconductor devices (e.g., transistors) located within active region 208 formed under the active surface 202 and/or passive components (e.g., capacitors, resistors, or other passive components) that may be located on or under the active surface 202. For example, each of the contact regions 206 may be electrically coupled to a gate, source, or drain of a transistor formed in the active region 208.

The semiconductor substrate 200 may comprise a bulk semiconductor substrate in wafer form, such as a full or partial wafer of semiconductor material that includes a number of semiconductor dies. For example, the semiconductor substrate 200 may comprise a single-crystal silicon substrate, a single-crystal compound-semiconductor substrate, a silicon-on-insulator ("SOI") type substrate (e.g., silicon-on-ceramic ("SOC"), silicon-on-glass ("SOG"), or silicon-on-sapphire ("SOS")), or another suitable semiconductor substrate in any suitable configuration. The semiconductor substrate 200 may also be a thinned full or partial semiconductor wafer having a thickness of, for example, about 750 µm.

Figure 3B:
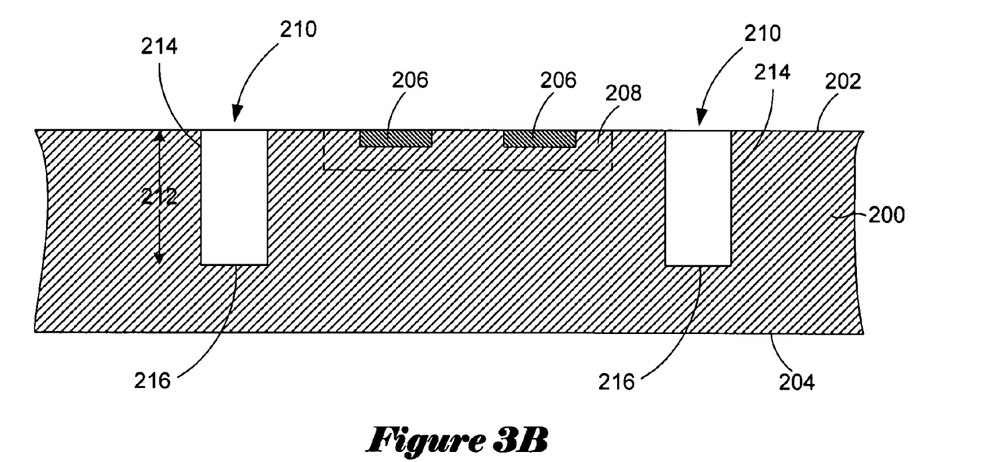

As shown in FIG. 3B, a number of openings or blind holes 210 are formed in the semiconductor substrate 200 that extend from the active surface 202 to an intermediate depth 212 within the semiconductor substrate 200. The openings 210 may be formed in portions of "dead space" of the semiconductor substrate 200, which are portions of the semiconductor substrate 200 without integrated circuitry. According to various embodiments of the present invention, the openings 210 may be formed by etching, by laser drilling, or by another suitable technique. For example, well-defined openings 210 having a diameter of, for example, about 500 nm to about 10 µm and an aspect ratio of, for example, about 10:1 to about 50:1 may be formed using an anisotropic dry etching process or laser drilling. Each of the openings 210 is defined by at least one sidewall 214 and a base 216. For example, an opening formed in a semiconductor substrate by anisotropic reactive ion etching may exhibit a cross-sectional geometry generally replicating a pattern defined by a mask on the first surface 202, a laser-drilled opening in a semiconductor substrate may exhibit a generally circular, cross-sectional geometry with only one sidewall, and an opening formed in a semiconductor substrate using certain wet etchants may produce a non-circular, cross-sectional geometry with distinct sidewalls joining at an angle when the wet etchant is formulated to etch specific crystallographic planes of a semiconductor substrate.

Figure 3C:
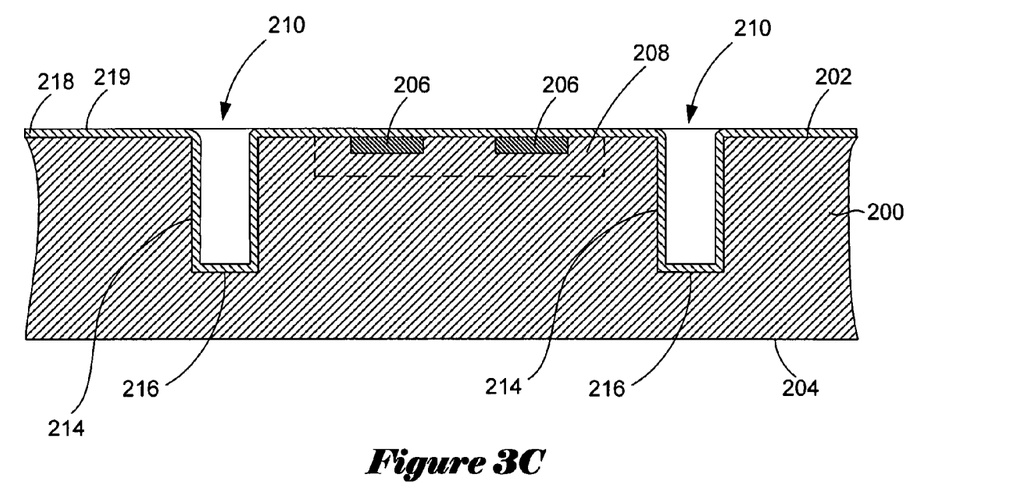
Figure 3D:
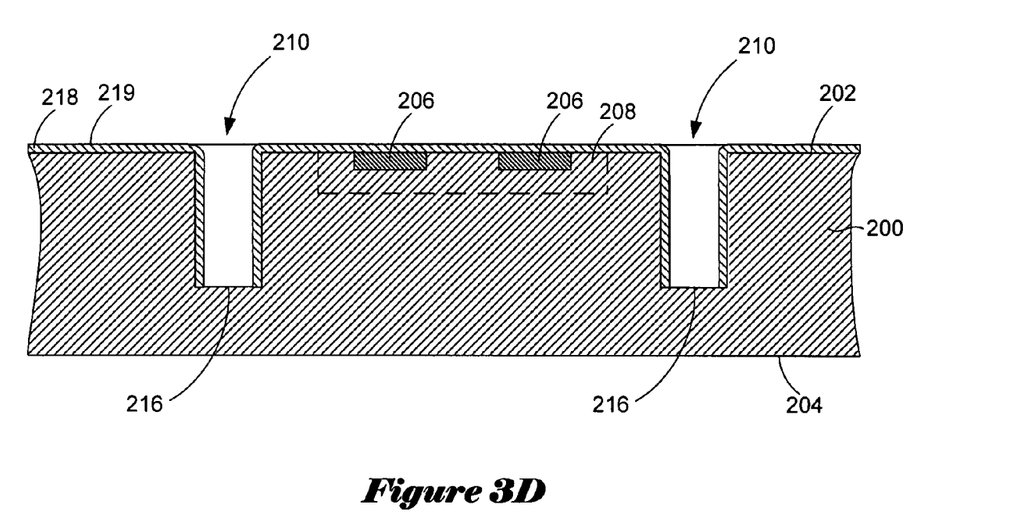

As shown in FIG. 3C, a dielectric layer 218 having an upper surface 219 may be thermally grown or deposited on the active surface 202 of the semiconductor substrate 200 and within the openings 210 to coat each of the sidewalls 214 and the bases 216. For example, the dielectric layer 218 may comprise an oxide or nitride, such as a silicon dioxide or silicon nitride passivation layer formed by thermal oxidation, chemical vapor deposition ("CVD"), atomic layer deposition ("ALD"), reactive sputtering, or another suitable technique. Furthermore, the dielectric layer 218 may also comprise one or more different types of dielectric layers. As shown in FIG. 3D, the portion of the dielectric layer 218 covering the base 216 of each of the openings 210 may be removed by appropriately masking the upper surface 219 of the dielectric layer 218 and employing an anisotropic dry etch. The dielectric layer 218 coating the at least one sidewall 214 of each of the openings 210, ultimately, will electrically isolate conductive material deposited in the openings 210 from the semiconductor substrate 200.

Figure 3E:
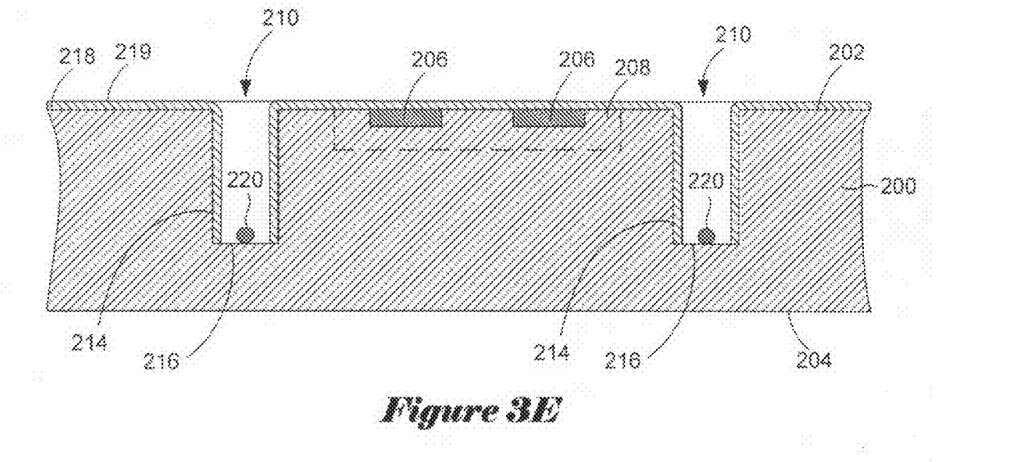

One or more metal-catalyst nanoparticles may be formed on, deposited on, or otherwise provided on the base 216 of each of the openings 210. As shown in FIG. 3E, according to one embodiment of the present invention, one or more metal-catalyst nanoparticles 220 may be selectively formed on the base 216 of each of the openings 210 using an electrochemical process or another suitable deposition process. The metal-catalyst nanoparticles 220 may exhibit a diameter or lateral dimension of less than about 100 nm and more particularly the diameter or lateral dimension may be about 5 nm to about 30 nm. Metal-catalyst nanoparticles of various different compositions may be used. For example, the metal-catalyst nanoparticles 220 may comprise gold, platinum, palladium, nickel, cobalt, titanium, alloys of any of the preceding metals, or another suitable catalytically-active material.

In one specific embodiment of the present invention, when the semiconductor substrate 200 comprises silicon, the semiconductor substrate 200 may be cleaned, if necessary, and immersed in a 1-2 mM solution of $NaAuCl_4 2H_2O$ in anhydrous ethanol to electrolessly deposit one or more gold nanocrystals on the base 216 of each of the openings 210. The gold nanocrystals preferentially deposit on the base 216 of the openings 210 instead of the dielectric layer 218 covering the sidewalls 214 because the portion of the dielectric layer 218 covering the base 216 has been removed and cleaned, providing an exposed silicon surface generally free of silicon dioxide for the gold nanocrystals to preferentially nucleate on. The use of gold nanocrystals as the nanoparticles 220 is merely an illustrative example. Nanoparticles having other compositions, such as platinum-, palladium-, nickel-, cobalt-, and titanium-containing nanoparticles may also be deposited using a similar electrochemical technique.

Figure 3F:
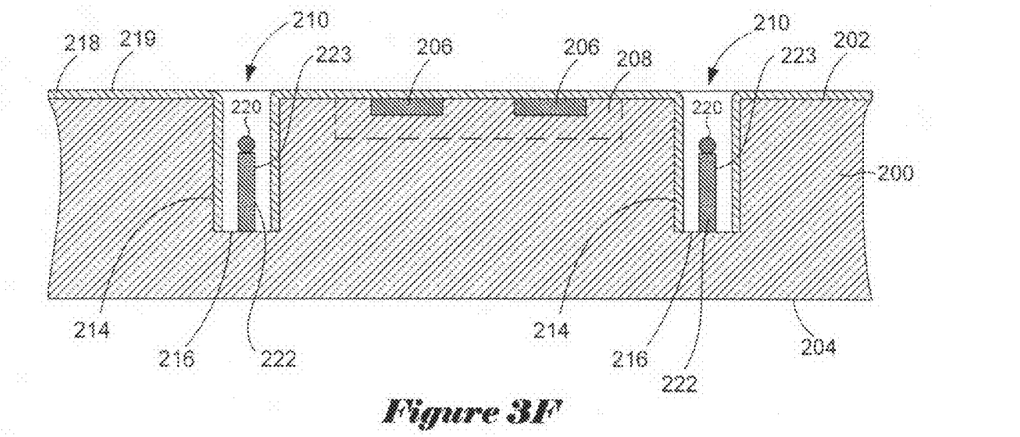
Figure 3G:
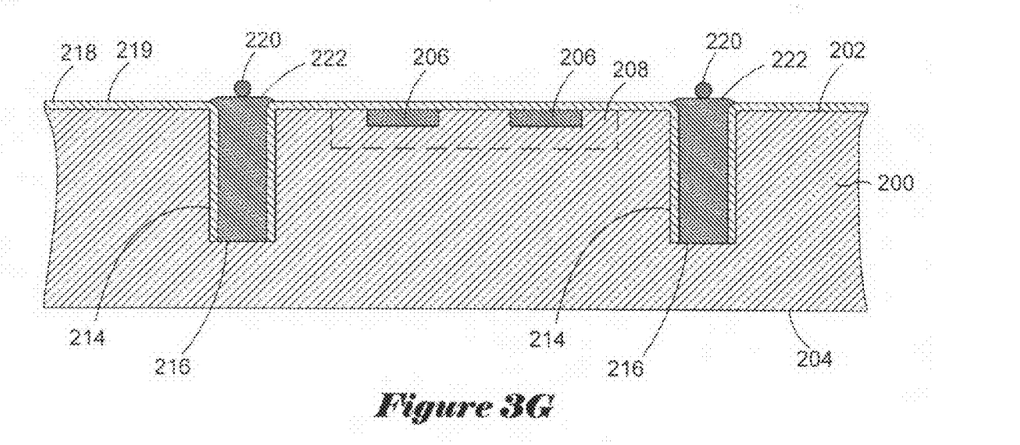

FIGS. 3F and 3G illustrate how a conductive material 222 is grown in the openings 210 under conditions in which the metal-catalyst nanoparticles 220 promote the deposition of the conductive material 222. As shown in FIG. 3F, the conductive material 222 may be grown by CVD in which the conductive material 222 grows as a result of a vapor-liquid-solid ("VLS") growth process or a vapor-solid growth process. The metal-catalyst nanoparticles 220 and the semiconductor substrate 200 may be heated to a temperature sufficient to establish intimate contact between the nanoparticles 220 and the underlying base 216 of the semiconductor substrate 200. Next, a precursor gas, such as silane ("$SiH_4$"), a mixture of $SiH_4$ and hydrochloric acid ("HCl"), dichlorosilane ("$SiH_2Cl_2$"), or germane ("$GeH_4$"), is flowed into the openings 210. The precursor gas may also include dopants for increasing the electrically conductivity of the conductive material 222 being grown. When the conductive material 222 is doped, the doping level is about $10^{18}$ $cm^{-3}$ to about $10^{21}$ $cm^{-3}$. As merely a non-limiting illustrative example, when the nanoparticles 220 are gold nanocrystals and the semiconductor substrate 200 comprises silicon, the precursor gas comes in contact with the gold nanocrystals, which are at least partially or completely melted to form gold droplets due to the temperature at which the CVD process is performed. By the time the precursor gas is introduced, the gold nanocrystals may be alloyed with silicon from the semiconductor substrate 200 to form a gold-silicon alloy. For example, silicon or germanium atoms from the precursor gas may dissolve in the gold droplets until the saturation limit of silicon or germanium in gold is reached. Then, the silicon or germanium atoms precipitate out of the gold droplets onto the silicon bases 216 of the semiconductor substrate 200 and grow epitaxially on the silicon base 216. The conductive material 222 may progressively grow as a single-crystal silicon or germanium nanowire due to continued dissolving of silicon or germanium atoms from the precursor gas and deposition onto the nanowire so-formed. In addition to or as an alternative to the silicon or germanium atoms dissolving in the gold nanocrystals, the silicon or germanium atoms may diffuse around the gold droplet and, initially, grow epitaxially at an interface between the silicon base 216 and the gold nanocrystal and/or an interface between the nanowire and the gold nanocrystal. Accordingly, the use of the metal-catalyst nanoparticles 220 enables preferentially growing the conductive material 222 within the openings 210 from the base 216 in a direction toward the active surface 202 to prevent prematurely closing the mouth of the openings 210 prior to the conductive material 222 substantially filling the openings 210.

As shown in FIGS. 3F and 3G, the growth process continues until the conductive material 222 displaces the metal-catalyst nanoparticles 220 above the upper surface 219 of the dielectric layer 218. FIG. 3F shows the growth of the conductive material 222 at an intermediate stage. The conductive material 222 may grow as a high-aspect ratio nanowire having a diameter or lateral dimension about the same size as a diameter or lateral dimension of the metal-catalyst nanoparticle 220 that promotes the growth of the nanowire. Thus, initially, the conductive material 222 filling one of the openings 210 may not laterally span between the sidewalls 214 partially defining the openings 210.

As shown in FIG. 3G, the conductive material 222 may be deposited to substantially fill each of the openings 210. Completely or substantially filling each of the openings 210 with the conductive material 222 may be effected by simply continuing to flow the precursor gas into the openings 210 until the conductive material 222 grows to substantially fill in the entire volume of the openings 210 by both lateral and vertical growth of the conductive material 222. In another embodiment of the present invention for substantially filling each of the openings 210, the temperature at which the deposition of the conductive material 222 is performed may be increased so that the un-catalyzed growth rate of the conductive material 222 is significant compared to the catalyzed growth rate of the conductive material 222. Thus, the conductive material 222 grows on side surfaces 223 of the nanowire. In yet another embodiment of the present invention for substantially filling each of the openings 210, the composition of the precursor gas may be altered so that the un-catalyzed growth rate of the conductive material 222 is significant compared to the catalyzed growth rate of the conductive material 222. For example, when the precursor gas is a mixture of $SiH_4$ and HCl, the concentration of HCl may be decreased so that the un-catalyzed growth rate of the conductive material 222 is significant compared to the catalyzed growth rate of the conductive material 222. In any of the growth techniques, the growth process may continue until the metal-catalyst nanoparticles 220 are displaced above the upper surface 219 of the dielectric layer 218, as shown in FIG. 3G.

In other embodiments of the present invention, the conductive material 222 may be grown using a vapor-solid growth process. For example, when the nanoparticles 220 comprise titanium nanocrystals and the semiconductor substrate 200 comprises silicon, the CVD deposition of silicon may be carried out a temperature in which the nanoparticles 220 are not partially or completely melted. In such an embodiment, silicon atoms may dissolve in the titanium nanocrystals until the saturation limit of silicon in titanium is reached. The silicon atoms may deposit epitaxially on the silicon base 216. In addition to or as an alternative to the silicon atoms dissolving in the titanium nanocrystals, the silicon atoms may diffuse around the titanium nanocrystals and, initially, grow epitaxially at the interface between the silicon base 216 and the titanium nanocrystals.

In various embodiments of the present invention, the temperature at which growth of the conductive material 222 occurs may be below about 600° C. and more particularly below about 400° C. to about 450° C. to prevent damage to the semiconductor devices or other components (e.g., contact regions) of the semiconductor substrate 200. Growth of the conductive material 222 at a temperature above 600° C. can result in redistribution of dopants of the semiconductor devices formed in the semiconductor substrate 200, and growth of the conductive material 222 at a temperature above about 400° C. to about 450° C. can also degrade metallization structures, such as contact regions or conductive lines associated with the active circuitry and/or passive components of the semiconductor substrate 200. The use of the metal-catalyst nanoparticles 220 enables growth of the conductive material 222 at approximately the same growth rate as ordinarily would occur at a higher temperature. For example, in the embodiment employing a semiconductor substrate 200 comprising silicon and gold nanocrystals as the metal-catalyst nanoparticles 220, the conductive material 222 may be grown from a precursor gas (e.g, $SiH_4$, $SiH_4/HCl$, $SiH_2Cl_2$, etc.) at a temperature of about 400° C. to about 450° C. at the same growth rate as would occur at a temperature that is about 100° C. to about 300° C. higher without using the gold nanocrystals.

Figure 3H:
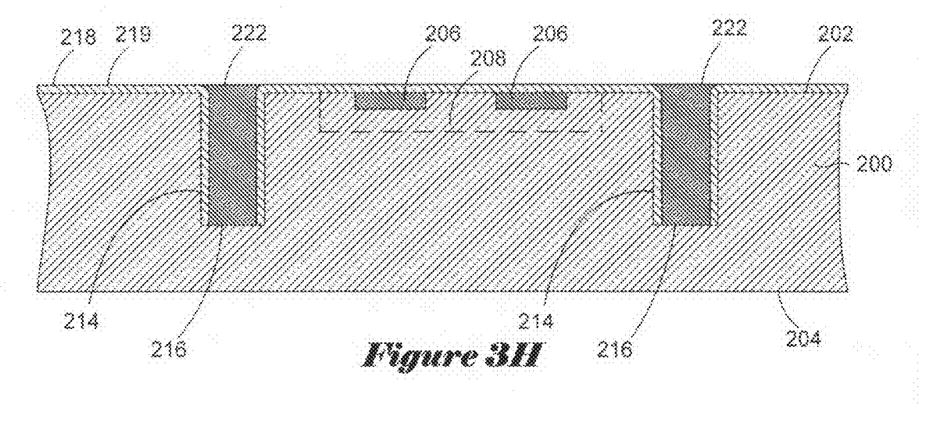
Figure 3I:
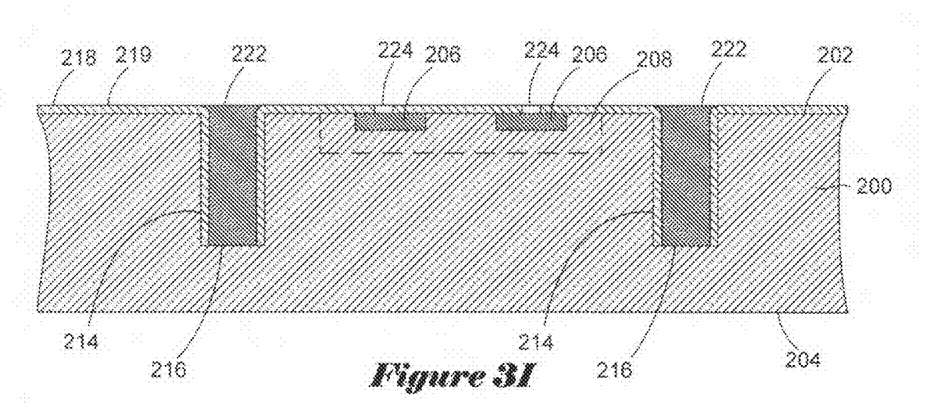
Figure 3J:
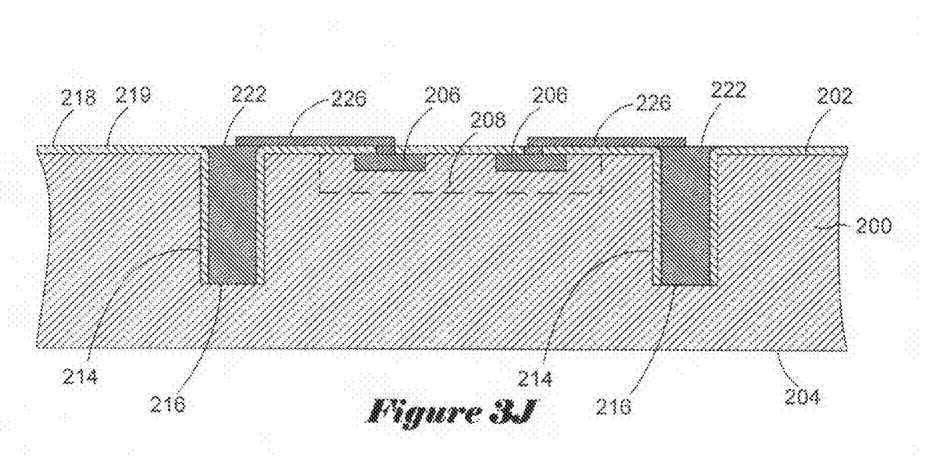
Figure 3K:
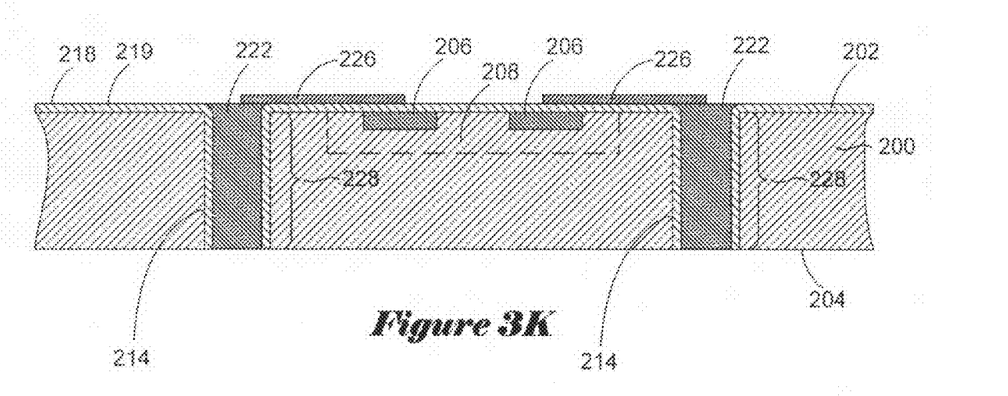

As shown in FIG. 3H, after substantially filling the openings 210 with the conductive material 222, a portion of the conductive material 222 filling each of the openings and the corresponding nanoparticles 220 may be removed in a controlled manner using a material removal process, such as chemical-mechanical planarization ("CMP"), so that the conductive material 222 does not extend past the upper surface 219 of the dielectric layer 218. As shown in FIG. 3I, openings 224 are formed in the dielectric layer 218 and over corresponding contact regions 206 by, for example, photolithographically patterning a photoresist layer deposited over the dielectric layer 218 and etching through the dielectric layer 218. Next, as shown in FIG. 3J, conductive lines 226 may be formed that electrically couple the conductive material 222 filling each of the openings 210 to corresponding contact regions 206 electrically coupled to active circuitry and/or passive components of the semiconductor substrate 200. For example, a layer comprising aluminum, copper, or an alloy of any of the preceding metals may be deposited over the upper surface 219 of the dielectric layer 218 to fill the openings 224 and patterned to form the conductive lines 226. As shown in FIG. 3K, the semiconductor substrate 200 is thinned by removing material from the back surface 204 of the semiconductor substrate 200 in a controlled manner using CMP or another suitable process to expose the conductive material 222 filing each of the openings 210, thus, forming through-substrate interconnects 228.

In another embodiment of the present invention, the dielectric layer 218 covering the base 216 of each of the openings 210 shown in FIG. 3C is not removed prior to deposition of the nanoparticles 220. When the dielectric layer 218 covers the bases 216, the nanoparticles 220 may be formed within each of the openings 210 using a physical deposition process, such as electron-beam deposition, atomic-beam deposition, or molecular-beam deposition. In such deposition techniques, a flux of the material is substantially perpendicular to the base 216 of each of the openings 210. By relatively orienting the flux of the material substantially perpendicular to the bases 216, a thin film of material is deposited predominately on the bases 216. Annealing of the as-deposited thin film causes agglomeration of the material comprising the thin film to form nanoparticles. Any excess nanoparticles that also form on the upper surface 219 of the dielectric layer 218 may be removed using, for example, CMP prior to or after growth of the conductive material 222 within the openings 210. When a portion of the dielectric layer 218 covers the bases 216, the conductive material 222 may not grow epitaxially on the base 216 of each of the openings 210 because the dielectric layer 218 may prevent epitaxial registry between the conductive material 222 and the underlying semiconductor substrate 200. In yet another embodiment of the present invention, the nanoparticles 220 may be deposited on the dielectric layer 218 covering the base 216 of each of the openings by directing a beam of nanoparticles. Again, any of the nanoparticles 220 that are deposited on the upper surface 219 of the dielectric layer 218 may be removed using, for example, CMP prior to or after growth of the conductive material 222 within the openings 210. Of course, any of the above nanoparticle formation and nanoparticle deposition techniques may also be employed when the bases 216 are not covered by the dielectric layer 218.

Figure 4A:
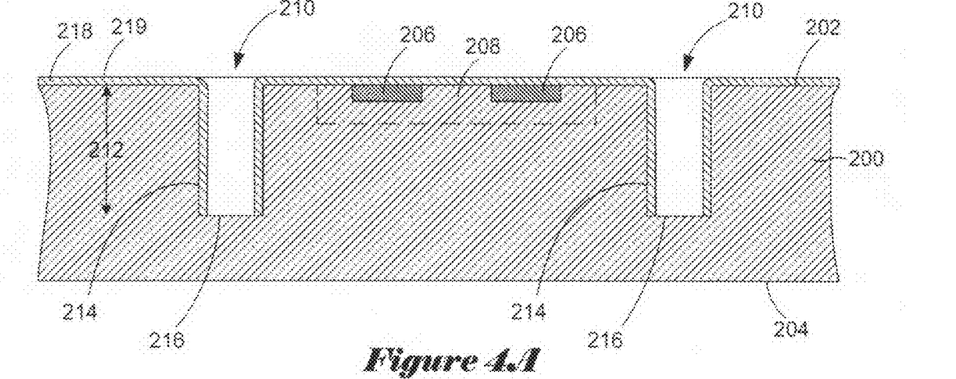
FIGS. 4A through 4G are schematic side cross-sectional views that illustrate various stages in a method of forming at least one through-substrate interconnect according to another embodiment of the present invention.

FIGS. 4A through 4G illustrate a method of forming at least one through-substrate interconnect by preferentially nucleating conductive material on a base of at least one opening formed in a semiconductor substrate according to another embodiment of the present invention. As shown in FIG. 4A, the semiconductor substrate 200 may be processed, as previously described with respect to FIGS. 3A through 3D, to form the openings 210 in the semiconductor substrate 200 with a dielectric layer 218 covering the active surface 202 and the sidewalls 214 of each of the openings 210. As shown in FIG. 4A, the base 216 of each of the openings 210 is not coated with the dielectric layer 218 because the portion of the dielectric layer 218 covering the bases 216 has not been deposited or has been selectively removed. Accordingly, the at least one sidewall 214 of each of the openings 210 is coated with a first material, such as silicon dioxide, silicon nitride, or another dielectric material, and the bases 216 of the openings 210 are comprised of the material that comprises the semiconductor substrate 200 or another material formed on the bases 216, such as a metal silicide. For example, a metal silicide may be formed on the base 216 of each of the openings 210 by depositing metal within each of the openings 210 using a physical deposition process, such as electron-beam deposition, atomic-beam deposition, molecular-beam deposition, or sputtering. The metal silicide may be formed by annealing the semiconductor substrate 200 and the deposited metal so that the deposited metal reacts with silicon of the base 216. No reaction occurs between the as-deposited metal and the dielectric layer 218 on the sidewalls 214 of the openings 210 and on the upper surface 219 of the dielectric layer 218. Accordingly, any of the as-deposited metal present on the dielectric layer 218 may be removed prior to growth of the conductive material within the openings 210 using, for example, selective chemical etching that removes the as-deposited metal, but not the metal silicide. The excess as-deposited metal on the upper surface 219 of the dielectric layer 218 may also be removed by CMP.

Figure 4B:
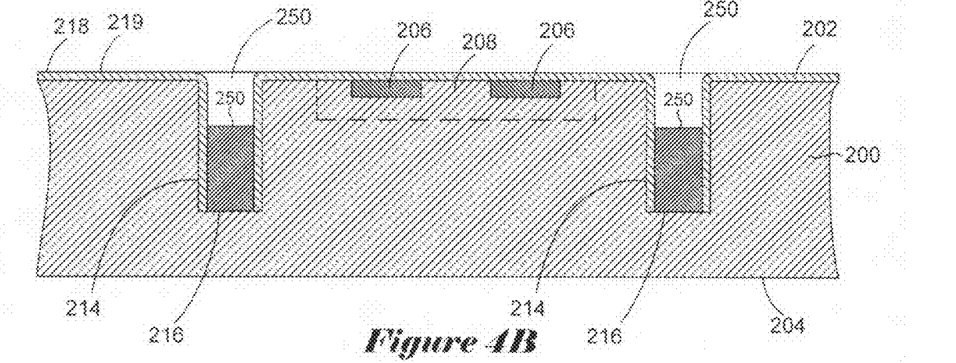

Next, as shown in FIG. 4B, a conductive material 250 is deposited within each of the openings 210 using a CVD process, an electrochemical process, (e.g., electroplating or electroless plating), or another suitable selective deposition process. The conductive material 250 is selected so that it preferentially nucleates on the base 216 of each of the openings 210 instead of on the sidewalls 214. In one embodiment of the present invention, silicon or germanium may be deposited, using a CVD process as previously described with respect to FIGS. 3A through 3K, which preferentially nucleates on the base 216 of each of the openings 210 and substantially fills the openings 210. In other embodiments of the present invention, tungsten may be deposited by low pressure CVD using tungsten hexacarbonyl ("$W(CO)_6$") or tungsten hexafluoride ("$WF_6$") as the precursor gas, or copper may be deposited by an electrochemical process, such as electroplating or electroless plating. The conductive material 250 may also be selectively doped during or after deposition to increase the electrically conductivity of the conductive material 250 being deposited.

Figure 4C:
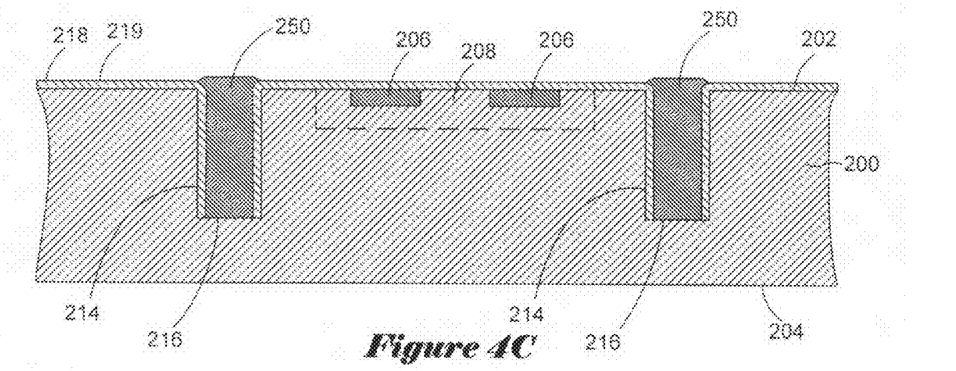

Regardless of the particular conductive material and deposition technique, the conductive material 250 preferentially nucleates on the base 216 of each of the openings 210 and does not substantially nucleate on the dielectric layer 218 covering the at least one sidewall 214 of each of the openings 210 to help prevent prematurely closing the opening 210 before being completely filled. FIG. 4C shows the stage during processing in which the openings 210 have been substantially filled with the conductive material 250. Also, the deposition of the conductive material 250 may be performed at the same, similar, or lower temperatures, than the temperatures previously discussed with respect to FIGS. 3A through 3K, to help eliminate or reduce damage to the active devices or other components of the semiconductor substrate 200. For example, electrochemically depositing the conductive material 250 may be performed at about room temperature.

Figure 4D:
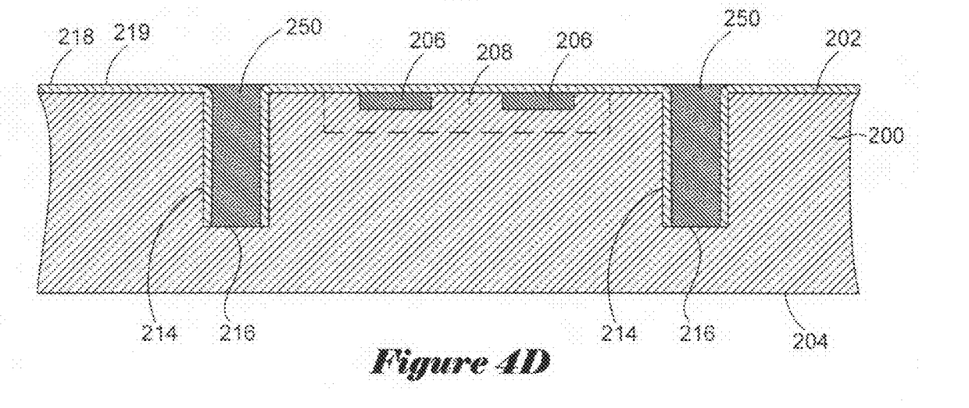

As shown in FIG. 4C, the conductive material 250 may substantially fill the entire volume of each of the openings 210, and extend past the upper surface 219 of the dielectric layer 218. As shown in FIG. 4D, after substantially filling the openings 210 with the conductive material 250, a portion of the conductive material 250 filling each of the openings can be removed in a controlled manner using a material removal process, such as CMP, so that the conductive material 250 does not extend past the upper surface 219 of the dielectric layer 218.

Figure 4E:
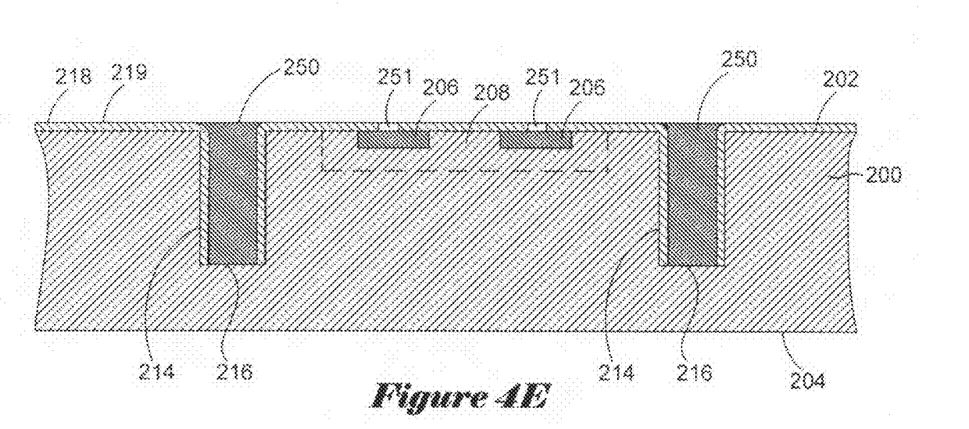
Figure 4F:
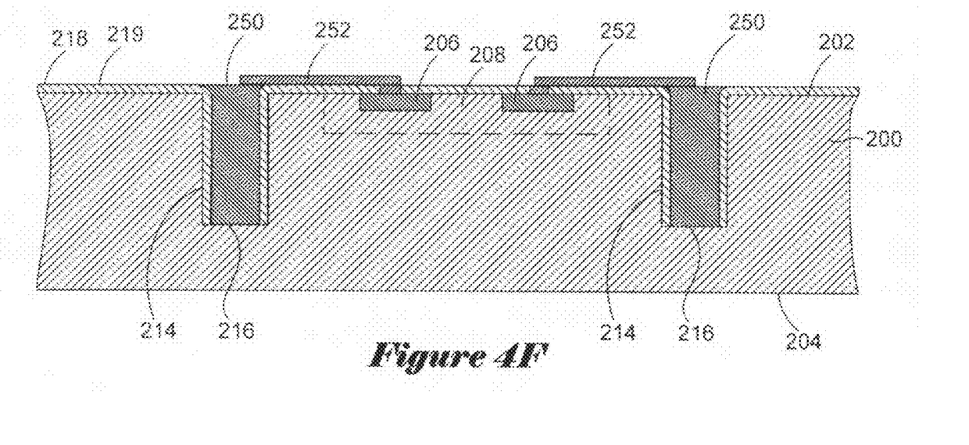
Figure 4G:
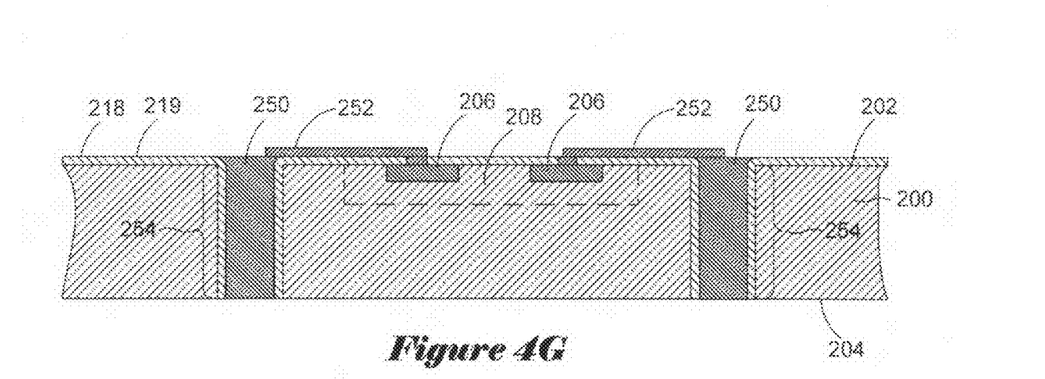

As shown in FIG. 4E, openings 251 are formed in the dielectric layer 218 and over corresponding contact regions 206 by, for example, photolithographically patterning a photoresist layer deposited over the dielectric layer 218 and etching through the dielectric layer 218. Next, as shown in FIG. 4F and previously described with respect to FIG. 3J, conductive lines 252 may be formed to electrically couple the conductive material 250 filling each of the openings 210 to corresponding contact regions 206 electrically coupled to active circuitry and/or passive components of the semiconductor substrate 200. As shown in FIG. 4G, the semiconductor substrate 200 is thinned by removing material from the back surface 204 of the semiconductor substrate 200 in a controlled manner using CMP or another suitable process to expose the conductive material 250 filing each of the openings 210, thus, forming through-substrate interconnects 254.

After forming the disclosed through-substrate interconnects, the semiconductor substrate may be singulated using any well-known technique, if necessary, to form individual semiconductor dies. Then, a number of different types of well-known semiconductor-device assembly configurations may be formed by appropriately stacking the individual semiconductor dies. In other embodiments of the present invention, multiple semiconductor substrates including the disclosed through-substrate interconnects may be stacked, bonded, and electrically interconnected to each other. Then, multiple semiconductor-device assemblies may be formed by appropriately sectioning through the stacked and bonded semiconductor substrates.

Although the present invention has been described in terms of particular embodiments, it is not intended that the present invention be limited to these embodiments. Modifications within the spirit of the present invention will be apparent to those skilled in the art. For example, in another embodiment of the present invention, the through-substrate interconnects may be formed in a semiconductor substrate prior to forming the active devices and/or passive components in the semiconductor substrate, and the active devices and/or passive components may be formed after partially or completely forming the through-substrate interconnects. In yet another embodiment of the present invention, the through-substrate interconnects may be formed in individual, singulated semiconductor dies as opposed to a relatively larger semiconductor substrate, such as a full or partial wafer.

The foregoing description, for purposes of explanation, used specific nomenclature to provide a thorough understanding of the present invention. However, it will be apparent to one skilled in the art that the specific details are not required in order to practice the present invention. The foregoing descriptions of specific embodiments of the present invention are presented for purposes of illustration and description. They are not intended to be exhaustive of or to limit the present invention to the precise forms disclosed. Obviously, many modifications and variations are possible in view of the above teachings. The embodiments are shown and described in order to best explain the principles of the present invention and its practical applications, to thereby enable others skilled in the art to best utilize the present invention and various embodiments with various modifications as are suited to the particular use contemplated. It is intended that the scope of the present invention be defined by the claims and their equivalents:

The invention claimed is:

1. A method of forming at least one through-substrate interconnect, comprising:
    providing a semiconductor substrate having a first surface and an opposing second surface;
    forming at least one opening in the semiconductor substrate, the at least one opening extending from the first surface to an intermediate depth within the semiconductor substrate, the at least one opening partially defined by a base;
    providing at least one metal-catalyst nanoparticle on the base instead of the sidewalls;
    growing conductive material within the at least one opening under conditions in which the metal-catalyst nanoparticle promotes deposition of the conductive material onto the base; and
    removing material of the semiconductor substrate from the second surface to expose a portion of the conductive material filling the at least one opening.

2. The method of claim 1 wherein providing at least one metal-catalyst nanoparticle on the base comprises forming the at least one metal-catalyst nanoparticle on the base instead of the sidewalls.

3. The method of claim 1 wherein providing at least one metal-catalyst nanoparticle on the base instead of the sidewalls comprises selectively forming the at least one metal-catalyst nanoparticle on the base instead of the sidewalls.

4. The method of claim 1 wherein providing at least one metal-catalyst nanoparticle on the base instead of the sidewalls comprises depositing the at least one metal-catalyst nanoparticle on the base instead of the sidewalls.

5. The method of claim 1 wherein the metal-catalyst nanoparticle comprises at least one of gold, platinum, palladium, nickel, cobalt, and titanium.

6. The method of claim 1 wherein depositing conductive material within the at least one opening under conditions in which the metal-catalyst nanoparticle promotes deposition of the conductive material comprises growing the conductive material using a vapor-liquid-solid growth process or a vapor-solid growth process.

7. The method of claim 1 wherein depositing conductive material within the at least one opening under conditions in which the metal-catalyst nanoparticle promotes deposition of the conductive material comprises depositing the conductive material using chemical vapor deposition.

8. The method of claim 1 wherein at least one sidewall of the at least one opening comprises an insulating layer and the base is generally free of an insulating layer.

9. The method of claim 1 wherein the first surface comprises an active surface under which a number of active semiconductor devices are formed.

10. The method of claim 1 wherein depositing conductive material within the at least one opening under conditions in which the metal-catalyst nanoparticle promotes deposition of the conductive material comprises filling the at least one opening with the conductive material until at least part of the at least one metal-catalyst nanoparticle is displaced above a mouth of the at least one opening.

11. The method of claim 10, further comprising removing the at least one metal-catalyst nanoparticle and a portion of the conductive material so that the conductive material does not extend past the mouth of the at least one opening.

12. A method of forming at least one through-substrate interconnect, comprising:
    providing a semiconductor substrate having a first surface and an opposing second surface;
    forming at least one opening in the semiconductor substrate, the at least one opening extending from the first surface to an intermediate depth within the semiconductor substrate, the at least one opening defined by at least one sidewall comprising a first material and a base comprising a second material;
    filling the at least one opening with conductive material having a selectivity to preferentially nucleate on the second material instead of nucleating on the first material; and
    removing material of the semiconductor substrate from the second surface to expose a portion of the conductive material filling the at least one opening, wherein the first material comprises an insulating layer and the second material comprises a metal silicide.

13. The method of claim 12 wherein first material comprises an insulating layer and the second material comprises an exposed surface of the semiconductor substrate.

14. The method of claim 12 wherein filling the at least one opening with conductive material having a selectivity to preferentially nucleate on the second material comprises depositing the conductive material using chemical vapor deposition or an electrochemical deposition process.

15. The method of claim 12 wherein the first surface comprises an active surface under which a number of active semiconductor devices are formed.

16. The method of claim 12 wherein filling the at least one opening with conductive material having a selectivity to preferentially nucleate on the second material of the base comprises filling the at least one opening with the conductive material until the conductive material extends past a mouth of the at least one opening.

17. The method of claim 16, further comprising removing a portion of the conductive material so that the conductive material does not extend past the mouth of the at least one opening.

18. The method of claim 17 wherein removing the portion of the conductive material is effected by a planarization process.

* * * * *